(12) United States Patent
Masuda et al.

(10) Patent No.: US 9,090,498 B2
(45) Date of Patent: Jul. 28, 2015

(54) SEALING MATERIAL AND PASTE MATERIAL USING SAME

(75) Inventors: Noriaki Masuda, Otsu (JP); Toru Shiragami, Otsu (JP); Hiroshi Arakawa, Otsu (JP); Hiroyuki Oshita, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 366 days.

(21) Appl. No.: 13/582,789

(22) PCT Filed: Mar. 2, 2011

(86) PCT No.: PCT/JP2011/054778
§ 371 (c)(1),
(2), (4) Date: Sep. 5, 2012

(87) PCT Pub. No.: WO2011/122218
PCT Pub. Date: Oct. 6, 2011

(65) Prior Publication Data
US 2012/0325789 A1  Dec. 27, 2012

(30) Foreign Application Priority Data

| Mar. 29, 2010 | (JP) | ................. | 2010-074098 |
| Oct. 25, 2010 | (JP) | ................. | 2010-238307 |
| Jan. 21, 2011 | (JP) | ................. | 2011-010344 |

(51) Int. Cl.
| C03C 8/14 | (2006.01) |
| C03C 8/08 | (2006.01) |
| C03C 8/24 | (2006.01) |
| H01L 51/52 | (2006.01) |

(52) U.S. Cl.
CPC ... *C03C 8/14* (2013.01); *C03C 8/08* (2013.01); *C03C 8/24* (2013.01); *H01L 51/5246* (2013.01)

(58) Field of Classification Search
CPC ............ C03C 8/24; C03C 8/245; C03C 8/14; C03C 8/02; C03C 8/20; C03C 8/16; C03C 8/04; C03C 4/00
USPC ............................... 501/15, 17, 18, 19, 20, 21
See application file for complete search history.

(56) References Cited

U.S. PATENT DOCUMENTS

| 5,281,560 A | 1/1994 | Francis et al. |
| 6,416,375 B1 | 7/2002 | Cho et al. |

(Continued)

FOREIGN PATENT DOCUMENTS

| CN | 101484396 | 7/2009 |
| EP | 0 522 263 | 1/1993 |

(Continued)

OTHER PUBLICATIONS

Chinese Office Action issued Apr. 24, 2014 in corresponding Chinese Application No. 201180015338.9 with English translation.

(Continued)

*Primary Examiner* — Noah Wiese
(74) *Attorney, Agent, or Firm* — Wenderoth, Lind & Ponack, L.L.P.

(57) ABSTRACT

Provided is a sealing material suitable for laser sealing, which enhances long-term reliability of an OLED display and the like. The sealing material comprises 80 to 99.7 mass % of an inorganic powder containing SnO-containing glass powder and 0.3 to 20 mass % of a pigment and is used for laser sealing.

25 Claims, 1 Drawing Sheet

(56) References Cited

U.S. PATENT DOCUMENTS

| | | | |
|---|---|---|---|
| 6,998,776 B2* | 2/2006 | Aitken et al. | 313/512 |
| 8,490,434 B2* | 7/2013 | Watanabe et al. | 65/155 |
| 2004/0207314 A1 | 10/2004 | Aitken et al. | |

FOREIGN PATENT DOCUMENTS

| | | | | |
|---|---|---|---|---|
| JP | 2004-059366 | | 2/2004 | |
| JP | 2008-059366 A | * | 2/2004 | C03C 3/23 |
| JP | 2006-524419 | | 10/2006 | |
| JP | 2006-315902 | | 11/2006 | |
| JP | 2008-115057 | | 5/2008 | |
| JP | 2008-115057 A | * | 5/2008 | C03C 8/14 |
| JP | 2009-234816 | | 10/2009 | |
| WO | 2008/007504 | | 1/2008 | |

OTHER PUBLICATIONS

International Search Report issued Apr. 19, 2011 in International (PCT) Application No. PCT/JP2011/054778.

International Preliminary Report on Patentability and Written Opinion of the International Searching Authority issued Nov. 1, 2012 in International (PCT) Application No. PCT/JP2011/054778.

Office Action issued Feb. 28, 2015 issued in corresponding Chinese Application No. 201180015338.9 (with English translation).

* cited by examiner

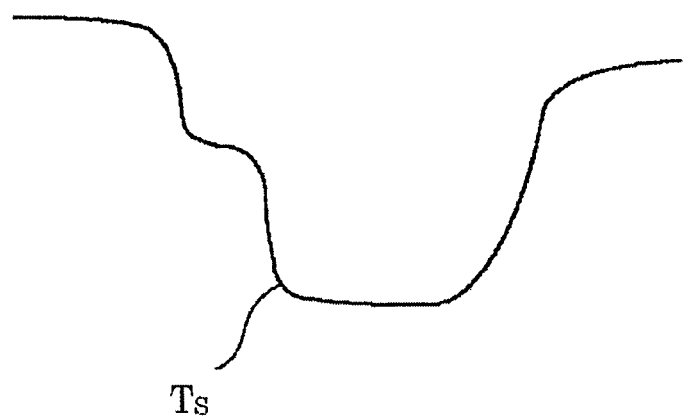

SEALING MATERIAL AND PASTE MATERIAL USING SAME

TECHNICAL FIELD

The present invention relates to a sealing material and a paste material using the same, and more specifically, to a sealing material used for sealing treatment with laser radiation (hereinafter, referred to as laser sealing) and a paste material using the same.

BACKGROUND ART

In recent years, an OLED display has been attracting attention as a flat display panel. The OLED display can be driven by a DC voltage, and hence its drive circuit can be simplified. In addition, the OLED display has advantages such as having no viewing angle dependence unlike a liquid crystal display, being bright due to its self-luminescence, and having a rapid response speed. At present, the OLED display is mainly used in a small portable appliance such as a mobile phone, and is expected to be applied to an ultra thin screen television in future. It should be noted that the OLED display mainly uses a system in which an active device such as a thin-film transistor (TFT) is arranged at each pixel for driving as is the case with the liquid crystal display.

The OLED display comprises, for example, two glass substrates, a negative electrode made of metal or the like, an organic light-emitting layer, a positive electrode made of ITO or the like, and a bonding material. An epoxy resin having low-temperature curing property or an organic resin-based bonding material such as a UV-curing resin may be used as the bonding material.

However, the organic resin-based bonding material has a drawback of being unable to block completely penetration of gas and moisture, though it has an advantage of being able to bond glass substrates to each other at low temperature. Thus, air tightness inside the resultant OLED display cannot be maintained and its organic light-emitting layer, which has low resistance to oxygen and moisture, is liable to degrade. Therefore, a failure that a display characteristic of the OLED display degrades time-dependently easily occurs, and when the OLED display is used over a long period, reliability of the display is liable to deteriorate.

In view of the foregoing, a sealing material containing glass powder may be used in place of the organic resin-based bonding material. The sealing material containing glass powder has excellent water resistance and is suitable for providing the air tightness inside the OLED display, in comparison to the organic resin-based bonding material.

However, the glass powder generally has a softening point of 300° C. or more, and hence it has been difficult to apply the glass powder to the OLED display. Specifically, when glass substrates are sealed to each other with the above-mentioned sealing material, it is necessary to put the whole OLED display in an electric furnace and fire it at a temperature equal to or higher than the softening point of the glass powder, thereby softening and flowing the glass powder. However, an active device used in an OLED display only has heat resistance to a temperature of about 120 to 130° C., and hence, when glass substrates are sealed to each other by this method, the active device is damaged by heat, resulting in degradation of a display characteristic of the resultant OLED display. In addition, an organic light-emitting material is also poor in heat resistance, and hence, when glass substrates are sealed to each other by this method, the organic light-emitting material is damaged by heat, resulting in degradation of a display characteristic of the resultant OLED display.

In view of the circumstances mentioned above, laser sealing has been studied in recent years as a method of sealing an OLED display. The laser sealing can locally heat only the sites that should be sealed, and hence glass substrates can be sealed to each other while thermal degradation of an active device and the like is prevented.

For example, Patent Literatures 1 and 2 describe that a front glass substrate and a back glass substrate in a display unit such as a field emission display are sealed to each other with laser radiation.

CITATION LIST

Patent Literature

Patent Literature 1: U.S. Pat. No. 6,416,375 A
Patent Literature 2: JP 2006-315902 A

SUMMARY OF INVENTION

Technical Problem

However, Patent Literatures 1 and 2 do not describe any specific material formulation of a sealing material containing glass powder, and hence it was not clear what kind of material formulation was suitable for laser sealing. Thus, even if a sealing material was irradiated with laser radiation, the sealing material was not able to absorb the laser radiation properly, and it was difficult to convert the energy of the laser radiation to thermal energy efficiently at sealing portions. It should be noted that when the output of laser radiation is increased, laser sealing can be performed even if the formulation of a sealing material is not optimized, but in this case, an active device and the like are heated, possibly resulting in the degradation of the display characteristic of the OLED display.

Further, as the softening point of glass powder becomes lower, the efficiency of laser sealing improves. Specifically, as the softening point of glass powder becomes lower, laser sealing is completed in a shorter time and the sealing strength at the time of the laser sealing can be enhanced.

Thus, a technical object of the present invention is to invent a sealing material suitable for laser sealing, to thereby enhance the long-term reliability of an OLED display and the like.

Solution to Problem

The inventors of the present invention have made intensive studies. As a result, the inventors have found that the above-mentioned technical object can be achieved by adding a pigment absorbing laser radiation in a given amount to a sealing material and using SnO glass powder therein, and propose the finding as a first invention.

That is, a sealing material according to the first invention comprises 80 to 99.7 mass % of an inorganic powder containing SnO-containing glass powder and 0.3 to 20 mass % of a pigment, the sealing material being used for laser sealing. Herein, the term "SnO-containing glass powder" refers to a glass powder containing SnO at 20 mol % or more in a glass composition (the same applies in the following). Further, the term "inorganic powder" refers to an inorganic material powder excluding a pigment and usually refers to a mixture of a glass powder and a refractory filler (the same applies in the following).

The above-mentioned inorganic powder contains SnO-containing glass powder. With this, the softening point of the glass powder lowers and the softening point of the resultant sealing material also lowers. As a result, laser sealing is completed in a shorter time and the sealing strength at the time of the laser sealing can be enhanced.

The above-mentioned sealing material comprises 80 to 99.7 mass % of an inorganic powder containing SnO-containing glass powder. With this, the air tightness inside an OLED display can be ensured, and hence it is possible to prevent a situation in which $H_2O$, $O_2$, and the like, which degrade an organic light-emitting layer, penetrate into the OLED display. As a result, the reliability of the OLED display can be enhanced. It should be noted that if the content of an inorganic powder is less than 80 mass % in a sealing material, the sealing material does not soften and flow sufficiently at the time of laser sealing, and it becomes difficult to enhance the sealing strength at the time of the laser sealing.

The above-mentioned sealing material comprises 0.3 to 20 mass % of a pigment. When the content of the pigment is controlled to 0.3 mass % or more, the energy of laser radiation can be converted to thermal energy efficiently, and hence only the sites that should be sealed can be easily heated locally. As a result, glass substrates can be sealed to each other with laser radiation while the thermal degradation of an active device and the like is prevented. On the other hand, when the content of the pigment is controlled to 20 mass % or less, it is possible to prevent a situation in which glass devitrifies at the time of laser sealing.

The above-mentioned sealing material is used for laser sealing. The sealing material of the present invention can properly absorb laser radiation, and hence can be suitably used for laser sealing. It should be noted that as described above, because laser sealing can locally heat only the sites that should be sealed, glass substrates can be sealed to each other while the thermal degradation of an active device and the like is prevented.

Various lasers can be used for the laser sealing, and a semiconductor laser, a YAG laser, a $CO_2$ laser, an excimer laser, an infrared laser, and the like are preferred because they are easy to handle (the same applies in the following).

Second, in the sealing material according to the first invention, the SnO-containing glass powder preferably comprises, as a glass composition in terms of mol %, 35 to 70% of SnO and 10 to 30% of $P_2O_5$. With this, the water resistance of glass can be easily enhanced while the low-melting point characteristic of the glass is maintained.

Third, in the sealing material according to the first invention, the SnO-containing glass powder preferably further comprises, as a glass composition in terms of mol %, 1 to 20% of ZnO, 1 to 20% of $B_2O_3$, and 0.1 to 10% of $Al_2O_3$. With this, the thermal stability of glass can be easily enhanced while the thermal expansion coefficient of the glass is decreased.

Fourth, in the sealing material according to the first invention, the pigment preferably comprises one kind or two or more kinds selected from carbon (C), $Co_3O_4$, CuO, $Cr_2O_3$, $Fe_2O_3$, $MnO_2$, SnO, and $Ti_nO_{2n-1}$ where n represents an integer. These pigments have excellent coloring property and absorb laser radiation well. Of those, carbon is preferably used as the pigment because of the following reasons. That is, carbon is inexpensive and absorbs laser radiation particularly well. In addition, carbon also has an effect of preventing a situation in which the nature of SnO-containing glass powder is altered at the time of laser sealing, that is, an effect of preventing a situation in which SnO in a glass composition is oxidized into $SnO_2$ at the time of laser sealing.

Fifth, in the sealing material according to the first invention, the inorganic powder preferably comprises 0.1 to 60 vol % of a refractory filler.

Sixth, in the sealing material according to the first invention, the refractory filler preferably comprises one kind or two or more kinds selected from cordierite, zircon, tin oxide, niobium oxide, zirconium phosphate, zirconium phosphate tungstate, and $NbZr(PO_4)_3$.

Seventh, the sealing material according to the first invention is preferably used for sealing an OLED device. Herein, the term "OLED device" encompasses an OLED display, an OLED lighting device, and the like.

Eighth, a paste material according to the first invention comprises a sealing material and a vehicle, wherein the sealing material comprises the above-mentioned sealing material and the vehicle comprises an aliphatic polyolefin-based carbonate.

Ninth, in the paste material according to the first invention, the vehicle preferably comprises one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG).

Tenth, the paste material according to the first invention is preferably subjected to debinder treatment in an inert atmosphere. Herein, the term "inert atmosphere" encompasses a neutral gas atmosphere such as an $N_2$ gas atmosphere and an Ar gas atmosphere, and a reduced pressure atmosphere such as a vacuum atmosphere.

Eleventh, the paste material according to the first invention is preferably subjected to laser sealing in an inert atmosphere.

Further, the inventors of the present invention have made intensive studies. As a result, the inventors have found that the above-mentioned technical object can be achieved by using, for laser sealing, a sealing material comprising SnO glass powder and a pigment having a predetermined particle size each in a given amount, and propose the finding as a second invention.

That is, a sealing material according to the second invention comprises 99 to 99.95 mass % of an inorganic powder containing SnO-containing glass powder and 0.05 to 1 mass % of a pigment, has an average particle diameter $D_{50}$ of primary particles of the pigment of 1 to 100 nm, the sealing material being used for laser sealing. Herein, the expression "$D_n$ (n represents any value)" refers to a value measured by a laser diffraction method, and refers to the particle diameter of a particle in which, in a cumulative particle size distribution curve on a volumetric basis when measured by the laser diffraction method, the integrated quantity thereof is n % when accumulated in the order starting from the particle having the smallest particle diameter (the same applies in the following). That is, the expression "$D_{50}$" refers to the particle diameter of a particle in which, in a cumulative particle size distribution curve on a volumetric basis when measured by the laser diffraction method, the integrated quantity thereof is 50% when accumulated in the order starting from the particle having the smallest particle diameter.

The above-mentioned inorganic powder contains SnO-containing glass powder. With this, the softening point of the glass powder lowers and hence the softening point of the resultant sealing material also lowers. As a result, laser sealing is completed in a shorter time and the sealing strength at the time of the laser sealing can be enhanced.

The above-mentioned sealing material comprises 99 to 99.95 mass % of an inorganic powder containing SnO-containing glass powder. With this, the air tightness inside an OLED display can be ensured, and hence it is possible to prevent a situation in which $H_2O$, $O_2$, and the like, which degrade an organic light-emitting layer, penetrate into the OLED display. As a result, the reliability of the OLED display can be enhanced. It should be noted that if the content of an inorganic powder is less than 99 mass % in a sealing material, the sealing material does not soften and flow sufficiently at the time of laser sealing, and it becomes difficult to enhance the sealing strength at the time of the laser sealing.

The above-mentioned sealing material comprises 0.05 to 1 mass % of a pigment. When the content of the pigment is controlled to 0.05 mass % or more, the energy of laser radiation can be converted to thermal energy efficiently, and hence only the sites that should be sealed can be easily heated locally. As a result, glass substrates can be sealed to each other with laser radiation while the thermal degradation of an active device and the like is prevented. On the other hand, when the content of the pigment is controlled to 1 mass % or less, it is possible to suppress excessive heating at the time of laser radiation irradiation and to prevent a situation in which glass devitrifies at the time of laser sealing.

In the above-mentioned sealing material, the average particle diameter $D_{50}$ of the primary particles of the pigment is controlled to 1 to 100 nm. If the average particle diameter $D_{50}$ of the primary particles of the pigment is too small, particles of the pigment easily aggregate, and hence the particles of the pigment do not easily disperse uniformly in a sealing material, and glass may not soften and flow locally at the time of laser sealing. On the other hand, if the average particle diameter $D_{50}$ of the primary particles of the pigment is too large, the particles of the pigment do not easily disperse uniformly in a sealing material as well, and glass may not soften and flow locally at the time of laser sealing. Thus, the average particle diameter $D_{50}$ of the primary particles of the pigment is preferably controlled in the above-mentioned range of values. In this case, the particles of the pigment disperse uniformly in a sealing material, and glass easily softens and flows at the time of laser sealing. That is, high sealing strength can be easily maintained by laser sealing.

The above-mentioned sealing material is used for laser sealing. The sealing material of the present invention can properly absorb laser radiation, and hence is suitable for laser sealing. It should be noted that as described above, because laser sealing can locally heat only the sites that should be sealed, glass substrates can be sealed to each other while the thermal degradation of an active device and the like is prevented.

Second, in the sealing material according to the second invention, the pigment preferably comprises carbon. The pigment has excellent coloring property and absorbs laser radiation well. In addition, carbon also has an effect of preventing a situation in which the nature of SnO-containing glass powder is altered at the time of laser sealing, that is, an effect of preventing a situation in which SnO in a glass composition is oxidized into $SnO_2$ at the time of laser sealing. It should be noted that various materials may be used as the carbon.

Third, in the sealing material according to the second invention, the pigment is preferably amorphous carbon or graphite.

Fourth, in the sealing material according to the second invention, the SnO-containing glass powder preferably comprises, as a glass composition in terms of mol %, 35 to 70% of SnO and 10 to 30% of $P_2O_5$. With this, the water resistance of glass can be easily enhanced while the low-melting point characteristic of the glass is maintained.

Fifth, in the sealing material according to the second invention, the SnO-containing glass powder preferably further comprises, as a glass composition, 1 to 20 mol % of ZnO.

Sixth, in the sealing material according to the second invention, the SnO-containing glass powder preferably further comprises, as a glass composition, 1 to 20 mol % of $B_2O_3$.

Seventh, in the sealing material according to the second invention, the SnO-containing glass powder preferably further comprises, as a glass composition, 0.1 to 10 mol % of $Al_2O_3$.

Eighth, in the sealing material according to the second invention, the inorganic powder preferably comprises 0.1 to 60 vol % of a refractory filler.

Ninth, in the sealing material according to the second invention, the refractory filler to be added preferably comprises one kind or two or more kinds selected from cordierite, zircon, tin oxide, niobium oxide, zirconium phosphate-based ceramic, and $NbZr(PO_4)_3$.

Tenth, the sealing material according to the second invention is preferably used for sealing an OLED device. Herein, the term "OLED device" encompasses an OLED display, an OLED lighting device, and the like.

Eleventh, a paste material according to the second invention comprises a sealing material and a vehicle, wherein the sealing material comprises the above-mentioned sealing material and the vehicle comprises an aliphatic polyolefin-based carbonate.

Twelfth, in the paste material according to the second invention, the vehicle preferably further comprises one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG).

Thirteenth, the paste material according to the second invention is preferably subjected to debinder treatment in an inert atmosphere. Herein, the term "inert atmosphere" encompasses a neutral gas atmosphere such as an $N_2$ gas atmosphere and an Ar gas atmosphere, and a reduced pressure atmosphere such as a vacuum atmosphere.

Fourteenth, the paste material according to the second invention is preferably subjected to laser sealing in an inert atmosphere.

Moreover, the inventors of the present invention have made intensive studies. As a result, the inventors have found that the above-mentioned technical object can be achieved by using a sealing material comprising at least SnO-containing glass powder, a refractory filler, and a pigment and controlling each of the particle size of the SnO-containing glass powder and the particle size of the refractory filler in a predetermined range, and propose the finding as a third invention.

That is, a sealing material according to the third invention comprises at least SnO-containing glass powder, a refractory filler, and a pigment, has a ratio of (an average particle diameter $D_{50}$ of the SnO-containing glass powder)/(an average particle diameter $D_{50}$ of the refractory filler) of 0.6 to 4, the sealing material being used for laser sealing.

The above-mentioned sealing material comprises at least SnO-containing glass powder, a refractory filler, and a pigment. With this, the efficiency and reliability of laser sealing can be enhanced. It should be noted that the SnO-containing glass powder has a low softening point, and hence can soften and flow at low temperature. The refractory filler has a low thermal expansion coefficient, and hence it is possible to reduce the thermal expansion coefficient of the sealing material. The pigment has excellent coloring property, and hence absorbs laser radiation well.

The inventors of the present invention have found that, when a fired film and an object to be sealed (such as a glass substrate) are brought into close contact with each other, even low output laser radiation enables laser sealing, and have also found that, when the ratio of (the average particle diameter $D_{50}$ of the SnO-containing glass powder)/(the average particle diameter $D_{50}$ of the refractory filler) is controlled to 0.6 to 4, the surface smoothness of a fired film (glazed film) improves and thus the adhesiveness between the fired film and an object to be sealed remarkably improves.

Thus, the above-mentioned sealing material can be used for laser sealing with low output laser radiation. Consequently, the air tightness inside the resultant OLED device can be properly ensured, and hence it is possible to prevent a situation in which $H_2O$, $O_2$, and the like, which degrade an organic light-emitting layer, penetrate into the OLED device. As a result, the long-term reliability of the OLED device can be enhanced.

Second, in the sealing material according to the third invention, the average particle diameter $D_{50}$ of the SnO-containing glass powder is preferably 1.0 to 3.0 µm.

Third, in the sealing material according to the third invention, the average particle diameter $D_{50}$ of the refractory filler is preferably 0.5 to 2.0 µm.

Fourth, in the sealing material according to the third invention, the pigment is preferably amorphous carbon or graphite. The amorphous carbon or the graphite has excellent coloring property and thus absorbs laser radiation well. In addition, the amorphous carbon or the graphite also has an effect of preventing a situation in which the nature of SnO-containing glass powder is altered at the time of laser sealing, that is, an effect of preventing a situation in which SnO in a glass composition is oxidized into $SnO_2$ at the time of laser sealing.

Fifth, in the sealing material according to the third invention, the average particle diameter $D_{50}$ of primary particles of the pigment is preferably 1 to 100 nm.

Sixth, in the sealing material according to the third invention, the content of the pigment is preferably 0.05 to 1 mass %. When the content of the pigment is controlled to 0.05 mass % or more, the energy of laser radiation can be converted to thermal energy efficiently, and hence only the portions that should be sealed can be easily heated locally. As a result, glass substrates can easily be sealed to each other with laser radiation while the thermal degradation of an active device and the like is prevented. On the other hand, when the content of the pigment is controlled to 1 mass % or less, it is possible to suppress excessive heating at the time of laser irradiation and to prevent easily a situation in which glass devitrifies at the time of laser sealing.

Seventh, in the sealing material according to the third invention, the SnO-containing glass powder preferably comprises, as a glass composition in terms of mol %, 35 to 70% of SnO and 10 to 30% of $P_2O_5$.

Eighth, in the sealing material according to the third invention, the SnO-containing glass powder preferably further comprises, as a glass composition, 1 to 20 mol % of ZnO.

Ninth, in the sealing material according to the third invention, the SnO-containing glass powder preferably further comprises, as a glass composition, 1 to 20 mol % of $B_2O_3$.

Tenth, in the sealing material according to the third invention, the SnO-containing glass powder preferably further comprises, as a glass composition, 0.1 to 10 mol % of $Al_2O_3$.

Eleventh, in the sealing material according to the third invention, the mixing ratio of the SnO-containing glass powder to the refractory filler is, in terms of vol %, preferably 40 to 99.9%:0.1 to 60%.

Twelfth, the sealing material according to the third invention preferably comprises, as the refractory filler, one kind or two or more kinds selected from cordierite, zircon, tin oxide, niobium oxide, zirconium phosphate-based ceramic, and $NbZr(PO_4)_3$.

Thirteenth, the sealing material according to the third invention is preferably used for sealing an OLED device. Herein, the term "OLED device" encompasses an OLED display, an OLED lighting device, and the like.

Fourteenth, a paste material according to the third invention comprises a sealing material and a vehicle, wherein the sealing material comprises the above-mentioned sealing material.

Fifteenth, in the paste material according to the third invention, the vehicle preferably comprises an aliphatic polyolefin-based carbonate.

Sixteenth, in the paste material according to the third invention, the vehicle preferably further comprises one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG).

Seventeenth, the paste material according to the third invention is preferably subjected to debinder treatment in an inert atmosphere. Herein, the term "inert atmosphere" encompasses a neutral gas atmosphere such as an $N_2$ gas atmosphere and an Ar gas atmosphere, and a reduced pressure atmosphere such as a vacuum atmosphere.

Eighteenth, the paste material according to the third invention is preferably subjected to laser sealing in an inert atmosphere.

Nineteenth, a method of producing a fired film according to the third invention comprises firing a paste material to produce a fired film, wherein the firing comprises firing the above-mentioned paste material so that the fired film has a surface roughness Ra of 0.6 µm or less and a surface roughness RMS of 1.0 µm or less. Herein, the term "surface roughness Ra" refers to a value measured by a method in accordance with JIS B0601:2001. Further, the term "surface roughness RMS" refers to a value measured by a method in accordance with JIS B0601:2001.

Twentieth, a laser sealing method according to the third invention comprises performing laser sealing by irradiating a fired film produced by the above-mentioned production method with laser radiation.

BRIEF DESCRIPTION OF DRAWING

FIG. 1 A schematic view illustrating the softening point of a sealing material (or glass powder) when measured with a macro-type DTA apparatus.

DESCRIPTION OF EMBODIMENTS

A first embodiment of the present invention is described. A sealing material according to the first embodiment comprises 80 to 99.7 mass % of an inorganic powder containing SnO-containing glass powder and 0.3 to 20 mass % of a pigment. The content of the inorganic powder is preferably 90 to 99 mass %, 95 to 99 mass %, particularly preferably 97 to 99 mass %. If the content of the inorganic powder is too small in a sealing material, the sealing material does not soften and flow sufficiently at the time of laser sealing, and it becomes difficult to enhance the sealing strength at the time of the laser sealing. On the other hand, if the content of the inorganic powder is too large, the content of the pigment becomes relatively small, and hence it becomes difficult to convert the energy of laser radiation to thermal energy. The content of the pigment is preferably 0.4 to 10 mass %, particularly preferably 0.6 to 10 mass %. If the content of the pigment is too small, it becomes difficult to convert the energy of laser radiation to thermal energy. On the other hand, if the content of the pigment is too large, the thermal stability of glass is liable to deteriorate.

In the sealing material according to the first embodiment, the average particle diameter $D_{50}$ of the SnO-containing glass powder is preferably less than 15 μm, 0.5 to 10 μm, particularly preferably 1 to 5 μm. When the average particle diameter $D_{50}$ of the SnO-containing glass powder is controlled to less than 15 μm, the gap between both glass substrates can be easily narrowed. In this case, a time necessary for performing laser sealing is shortened, and cracks and the like do not easily occur in the glass substrates and sealing portions even if there is a difference in thermal expansion coefficient between each of the glass substrates and the sealing material.

In the sealing material according to the first embodiment, the maximum particle diameter $D_{99}$ of the SnO-containing glass powder is preferably 30 μm or less, 20 μm or less, particularly preferably 10 μm or less. When the maximum particle diameter $D_{99}$ of the SnO-containing glass powder is controlled to 30 μm or less, the gap between both glass substrates can be easily narrowed. In this case, a time necessary for performing laser sealing is shortened, and cracks and the like do not easily occur in the glass substrates and sealing portions even if there is a difference in thermal expansion coefficient between each of the glass substrates and the sealing material.

In the sealing material according to the first embodiment, the SnO-containing glass preferably contains 35 to 70% of SnO and 10 to 30% of $P_2O_5$ as a glass composition. The reasons why the range of the glass composition has been limited to the above are described below. It should be noted that in the description of the range of a glass composition, the expression "%" refers to "mol %" unless otherwise specified.

SnO is a component that contributes to producing glass having a lower melting point and is an essential component. The content of SnO is preferably 35 to 70%, 40 to 70%, particularly preferably 50 to 68%. Particularly when the content of SnO is 50% or more in glass, the glass easily softens and flows at the time of laser sealing. It should be noted that if the content of SnO is less than 35% in glass, the viscosity of the glass becomes too high and it becomes difficult to perform laser sealing with a desired laser output. On the other hand, if the content of SnO is more than 70% in glass, the vitrification of the glass is apt to be difficult.

$P_2O_5$ is a glass-forming oxide and is a component that enhances the thermal stability of glass. The content of $P_2O_5$ is preferably 10 to 30%, 15 to 27%, particularly preferably 15 to 25%. If the content of $P_2O_5$ is less than 10% in glass, the thermal stability of the glass is apt to deteriorate. On the other hand, if the content of $P_2O_5$ is more than 30% in glass, the climate resistance of the glass deteriorates, and hence it becomes difficult to ensure the long-term reliability of an OLED device or the like using the glass.

The following components can be added in addition to the above-mentioned components.

ZnO is an intermediate oxide and is a component that stabilizes glass. The content of ZnO is preferably 0 to 30%, 1 to 20%, particularly preferably 1 to 15%. If the content of ZnO is more than 30% in glass, the thermal stability of the glass is apt to deteriorate.

$B_2O_3$ is a glass-forming oxide and is a component that stabilizes glass. Further, $B_2O_3$ is a component that enhances the climate resistance of glass. The content of $B_2O_3$ is preferably 0 to 20%, 1 to 20%, particularly preferably 2 to 15%. If the content of $B_2O_3$ is more than 20% in glass, the viscosity of the glass becomes too high and it becomes difficult to perform laser sealing with a desired laser output.

$Al_2O_3$ is an intermediate oxide and is a component that stabilizes glass. Besides, $Al_2O_3$ is a component that lowers the thermal expansion coefficient of glass. The content of $Al_2O_3$ is preferably 0.1 to 10%, particularly preferably 0.5 to 5%. If the content of $Al_2O_3$ is more than 10% in glass powder, the softening point of the glass powder improperly rises and it becomes difficult to perform laser sealing with a desired laser output.

$SiO_2$ is a glass-forming oxide and is a component that stabilizes glass. The content of $SiO_2$ is preferably 0 to 15%, particularly preferably 0 to 5%. If the content of $SiO_2$ is more than 15% in glass powder, the softening point of the glass powder improperly rises and it becomes difficult to perform laser sealing with a desired laser output.

$In_2O_3$ is a component that enhances the thermal stability of glass and the content of $In_2O_3$ is preferably 0 to 5%. If the content of $In_2O_3$ is more than 5%, batch cost soars.

$Ta_2O_5$ is a component that enhances the thermal stability of glass and the content of $Ta_2O_5$ is preferably 0 to 5%. If the content of $Ta_2O_5$ is more than 5% in glass powder, the softening point of the glass powder improperly rises and it becomes difficult to perform laser sealing with a desired laser output.

$La_2O_3$ is a component that enhances the thermal stability of glass and is a component that enhances the climate resistance of glass. The content of $La_2O_3$ is preferably 0 to 15%, 0 to 10%, particularly preferably 0 to 5%. If the content of $La_2O_3$ is more than 15%, batch cost soars.

$MoO_3$ is a component that enhances the thermal stability of glass and the content of $MoO_3$ is preferably 0 to 5%. If the content of $MoO_3$ is more than 5% in glass powder, the softening point of the glass powder improperly rises and it becomes difficult to perform laser sealing with a desired laser output.

$WO_3$ is a component that enhances the thermal stability of glass and the content of $WO_3$ is preferably 0 to 5%. If the content of $WO_3$ is more than 5% in glass powder, the softening point of the glass powder improperly rises and it becomes difficult to perform laser sealing with a desired laser output.

$Li_2O$ is a component that contributes to producing glass having a lower melting point and the content of $Li_2O$ is preferably 0 to 5%. If the content of $Li_2O$ is more than 5% in glass, the thermal stability of the glass is apt to deteriorate.

$Na_2O$ is a component that contributes to producing glass having a lower melting point and the content of $Na_2O$ is preferably 0 to 10%, particularly preferably 0 to 5%. If the content of $Na_2O$ is more than 10% in glass, the thermal stability of the glass is apt to deteriorate.

$K_2O$ is a component that contributes to producing glass having a lower melting point and the content of $K_2O$ is preferably 0 to 5%. If the content of $K_2O$ is more than 5% in glass, the thermal stability of the glass is apt to deteriorate.

MgO is a component that enhances the thermal stability of glass and the content of MgO is preferably 0 to 15%. If the content of MgO is more than 15% in glass powder, the softening point of the glass powder improperly rises and it becomes difficult to perform laser sealing with a desired laser output.

BaO is a component that enhances the thermal stability of glass and the content of BaO is preferably 0 to 10%. If the content of BaO is more than 10% in glass, the balance of the components in the composition of the glass is impaired, and the glass is liable to denitrify to the worse.

$F_2$ is a component that contributes to producing glass having a lower melting point and the content of $F_2$ is preferably 0 to 5%. If the content of $F_2$ is more than 5% in glass, the thermal stability of the glass is apt to deteriorate.

In view of providing thermal stability and a low-melting point characteristic to glass, the total content of $In_2O_3$, $Ta_2O_5$, $La_2O_3$, $MoO_3$, $WO_3$, $Li_2O$, $Na_2O$, $K_2O$, MgO, BaO, and $F_2$ is preferably 10% or less.

In addition to the above-mentioned components, other components (such as CaO and SrO) can be added, for example, up to 10%.

In the sealing material according to the first embodiment, from the standpoint of reducing the batch cost of the SnO-containing glass powder, the content of transition metal oxides in the SnO-containing glass powder is preferably 10% or less, particularly preferably 5% or less, and it is more preferred that the SnO-containing glass powder be substantially free of transition metal oxides. When the SnO-containing glass powder is substantially free of transition metal oxides, it becomes easy to prevent a situation in which the thermal stability of glass deteriorates. Herein, the phrase "substantially free of transition metal oxides" refers to a case where the content of transition metal oxides in a glass composition is 3,000 ppm (by mass) or less, preferably 1,000 ppm (by mass) or less (the same applies in the following).

It should be noted that it is preferred that the SnO-containing glass powder be substantially free of PbO from an environmental standpoint. Herein, the phrase "substantially free of PbO" refers to a case where the content of PbO in the glass composition is 1,000 ppm (by mass) or less (the same applies in the following).

In the sealing material according to the first embodiment, it is preferred to use, as the pigment, an inorganic pigment, it is more preferred to use one kind or two or more kinds selected from carbon, $Co_3O_4$, CuO, $Cr_2O_3$, $Fe_2O_3$, $MnO_2$, SnO, and $Ti_nO_{2n-1}$, (n represents an integer), and it is particularly preferred to use carbon. These pigments have excellent coloring property and absorb laser radiation well. Amorphous carbon or graphite is preferred as the carbon. The carbon has the feature that primary particles are easily processed so as to have an average particle diameter $D_{50}$ of 1 to 100 nm.

The pigment is preferably substantially free of Cr-based oxides from an environmental standpoint. Herein, the phrase "substantially free of Cr-based oxides" refers to a case where the content of Cr-based oxides in a pigment is 1,000 ppm (by mass) or less (the same applies in the following).

The average particle diameter $D_{50}$ of the pigment (aggregate) is preferably 0.1 to 3 µm, particularly preferably 0.3 to 1 µm. Further, the maximum particle diameter $D_{99}$ of the pigment is preferably 0.5 to 10 µm, particularly preferably 1 to 5 µm. If the particle size of the pigment is too large, the particles of the pigment do not easily disperse uniformly in a sealing material, and glass may not soften and flow locally at the time of laser sealing. If the particle size of the pigment is too small, particles of the pigment easily aggregate to each other as well, and hence glass may not soften and flow locally at the time of laser sealing.

In the sealing material according to the first embodiment, the inorganic powder preferably comprises a refractory filler. With this, the thermal expansion coefficient of the sealing material can be reduced and the mechanical strength of the sealing material can be enhanced. The mixing ratio of the SnO-containing glass powder to the refractory filler in the inorganic powder is, in terms of vol %, preferably 40 to 100%:0 to 60%, particularly preferably 50 to 90%:10 to 50%. If the content of the refractory filler is too small, an effect of the refractory filler is not easily exerted. On the other hand, if the content of the refractory filler is too large, the ratio of the SnO-containing glass powder becomes relatively small and the efficiency of laser sealing is liable to deteriorate.

As the refractory filler, there may be used zircon, zirconia, tin oxide, quartz, β-spodumene, cordierite, mullite, quartz glass, β-eucryptite, β-quartz, zirconium phosphate, zirconium phosphate tungstate, zirconium tungstate, a compound having a basic structure of [$AB_2$ ($MO_4$)$_3$] such as NbZr($PO_4$)$_3$, where A represents Li, Na, K, Mg, Ca, Sr, Ba, Zn, Cu, Ni, Mn, or the like, B represents Zr, Ti, Sn, Nb, Al, Sc, Y, or the like, and M represents P, Si, W, Mo, or the like, and a solid solution thereof.

The maximum particle diameter $D_{99}$ of the refractory filler is preferably 30 µm or less, 20 µm or less, particularly preferably 10 µm or less. If the maximum particle diameter $D_{99}$ of the refractory filler is more than 30 µm, some parts of sealing portions are liable to have a thickness of 30 µm or more, and hence the gap between glass substrates becomes non-uniform in an OLED display, and consequently, it becomes difficult to reduce the thickness of the OLED display. Further, when the maximum particle diameter $D_{99}$ of the refractory filler is controlled to 30 µm or less, the gap between both glass substrates can be easily narrowed. In this case, a time necessary for performing laser sealing is shortened, and cracks and the like do not easily occur in the glass substrates and sealing portions even if there is a difference in thermal expansion coefficient between each of the glass substrates and the sealing material.

In the sealing material according to the first embodiment, the softening point (softening temperature) is preferably 450° C. or less, 420° C. or less, particularly preferably 400° C. or less. If the softening point is more than 450° C., the efficiency of laser sealing is liable to deteriorate. The lower limit of the softening point is not particularly limited, but in view of the thermal stability of glass, the softening point is preferably controlled to 300° C. or more. Herein, the term "softening point" refers to a value measured under a nitrogen atmosphere with a macro-type differential thermal analysis (DTA) apparatus, and in the DTA, the measurement starts from room temperature and the temperature increase rate is set to 10° C./min. It should be noted that the softening point measured with the macro-type DTA apparatus refers to a temperature (Ts) at a fourth inflection point illustrated in FIG. 1.

At present, an active matrix drive system, in which an active device such as a TFT is arranged at each pixel for driving, is adopted as a drive system in an OLED display. In this case, alkali-free glass (such as OA-10G manufactured by Nippon Electric Glass Co., Ltd.) is used for glass substrates for the OLED display. The thermal expansion coefficient of alkali-free glass is usually $40 \times 10^{-7}/°$ C. or less. The thermal expansion coefficient of a sealing material is 76 to $83 \times 10^{-7}/°$ C. in many cases. Thus, it was difficult to match the thermal expansion coefficient of a sealing material strictly to the thermal expansion coefficient of alkali-free glass. In contrast, the SnO-containing glass powder contained in the sealing material according to the first embodiment has good compatibility with a low-expansion refractory filler, in particular, NbZr($PO_4$)$_3$ and zirconium phosphate. Therefore, when the SnO-containing glass powder according to the present invention is used in a sealing material, the thermal expansion coefficient of the sealing material can be remarkably reduced. In the sealing material according to the first embodiment, the thermal expansion coefficient is preferably $75 \times 10^{-7}/°$ C. or less, $65 \times 10^{-7}/°$ C. or less, $55 \times 10^{-7}/°$ C. or less, particularly preferably $49 \times 10^{-7}/°$ C. or less. With this, a stress applied to sealing portions becomes smaller and the stress cracking of the sealing portions can be prevented. Herein, the term "thermal expansion coefficient" refers to an average value of values each measured with a push-rod-type thermal expansion coefficient measurement (TMA) apparatus in the temperature range of 30 to 250° C.

The sealing material according to the first embodiment and a vehicle are preferably kneaded and processed into a paste material. With this, coating workability and the like can be enhanced. It should be noted that a vehicle usually contains a resin binder and a solvent.

In the paste material according to the first embodiment, it is preferred to use, as a resin binder, an aliphatic polyolefin-based carbonate, and it is particularly preferred to use polyethylene carbonate and polypropylene carbonate. These resin binders have the feature of suppressing the nature of SnO-containing glass powder from being altered at the time of laser sealing.

In the paste material according to the first embodiment, the solvent preferably comprises one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG). These solvents are characterized by being less likely to alter the nature of an SnO-containing glass powder at the time of laser sealing. Of these solvents, one kind or two or more kinds selected from propylene carbonate, phenyl diglycol (PhDG), dibutyl phthalate (DBP), benzyl glycol (BzG), benzyl diglycol (BzDG), and phenyl glycol (PhG) are particularly preferred. Each of these solvents has a boiling point of 240° C. or more. Thus, when any of these solvents is used, volatilization of the solvent used can be easily suppressed in a coating work such as screen printing. As a result, a paste material containing the solvent can be stably used for a long period. Further, phenyl diglycol (PhDG), dibutyl phthalate (DBP), benzyl glycol (BzG), benzyl diglycol (BzDG), and phenyl glycol (PhG) have high affinity to a pigment. Thus, even if any of these solvents is added in a small amount, it is possible to suppress a situation in which the pigment is separated from the added solvent in the paste material.

As mentioned above, propylene carbonate, phenyl diglycol (PhDG), dibutyl phthalate (DBP), benzyl glycol (BzG), benzyl diglycol (BzDG), and phenyl glycol (PhG) have an effect of suppressing the volatilization of a solvent, thereby enhancing the long-term stability of the paste material. Phenyl diglycol (PhDG) is taken as an example to describe this effect specifically. First, phenyl diglycol (PhDG) was externally added to propylene carbonate as described in Table 1, thereby preparing various solvents. Next, each of the solvents was dropped in a given amount on a glass substrate (OA-10G manufactured by Nippon Electric Glass Co., Ltd.), and the glass plate was left to stand still as described in Table 1. Finally, the reduced rate of each solvent was measured, thereby evaluating the influence of phenyl diglycol (PhDG) on the drying speed of the paste material. Table 1 shows the results.

TABLE 1

| | Reduced rate of solvent | | | |
|---|---|---|---|---|
| | 120 minutes | 240 minutes | 360 minutes | 480 minutes |
| PhDG 0 wt % | 17.1 | 32.2 | 45.2 | 57.4 |
| PhDG 4.6 wt % | 17.7 | 31.5 | 43.8 | 56.3 |
| PhDG 9.3 wt % | 15.0 | 28.5 | 43.0 | 52.5 |
| PhDG 13.9 wt % | 15.0 | 28.5 | 41.4 | 51.5 |

According to Table 1, when the content of phenyl diglycol (PhDG) increases, the reduced rate of the solvent decreases. Thus, it is found that, when phenyl diglycol (PhDG) is added, the drying speed of the resultant paste material becomes slower, and consequently, the long-term stability of the paste material improves.

The paste material according to the first embodiment is preferably subjected to debinder treatment in an inert atmosphere, and is particularly preferably subjected to debinder treatment in an $N_2$ atmosphere. With this, it is possible to prevent easily a situation in which the nature of SnO-containing glass powder is altered at the time of debinder treatment. Besides, the paste material according to the first embodiment is preferably subjected to laser sealing in an inert atmosphere, and is particularly preferably subjected to laser sealing in an $N_2$ atmosphere. With this, it becomes easy to prevent a situation in which the nature of SnO-containing glass powder is altered at the time of laser sealing.

Next, a second embodiment of the present invention is described. A sealing material according to the second embodiment comprises 99 to 99.95 mass % of an inorganic powder containing SnO-containing glass powder and 0.05 to 1 mass % of a pigment. In particular, the content of the inorganic powder is preferably 99.5 to 99.9 mass %. If the content of the inorganic powder is less than 99 mass % in a sealing material, the sealing material does not soften and flow sufficiently at the time of laser sealing, and it becomes difficult to enhance the sealing strength at the time of the laser sealing. On the other hand, if the content of the inorganic powder is more than 99.95 mass %, the content of the pigment becomes relatively small, and hence it becomes difficult to convert the energy of laser radiation to thermal energy. The content of the pigment is particularly preferably 0.1 to 0.5 mass %. If the content of the pigment is too small, it becomes difficult to convert the energy of laser radiation to thermal energy. On the other hand, if the content of the pigment is too large in a sealing material, the sealing material is excessively heated at the time of laser sealing, with the results that the thermal degradation of a device progresses, SnO-containing glass is liable to denitrify, and sealing strength is liable to lower.

In the sealing material according to the second embodiment, the average particle diameter $D_{50}$ of the primary particles of the pigment is preferably 1 to 100 nm, 3 to 70 nm, 5 to 60 nm, particularly preferably 10 to 50 nm. If the size of the primary particles of the pigment is too small, particles of the pigment easily aggregate to each other, and hence it becomes difficult to disperse the particles of the pigment uniformly in a sealing material, and glass may not soften and flow locally at the time of laser sealing. On the other hand, if the size of the primary particles of the pigment is too large, it becomes difficult to disperse the particles of the pigment uniformly in a sealing material as well, and SnO-containing glass powder may not soften and flow locally at the time of laser sealing.

In the sealing material according to the second embodiment, an inorganic pigment is preferably used as the pigment.

Specifically, an inorganic pigment such as carbon described in the first embodiment can be used as well.

The pigment is preferably substantially free of Cr-based oxides from an environmental standpoint.

In the sealing material according to the second embodiment, the average particle diameter $D_{50}$ of the SnO-containing glass powder is preferably less than 15 µm, 0.5 to 10 µm, particularly preferably 1 to 5 µm. When the average particle diameter $D_{50}$ of the SnO-containing glass powder is controlled to less than 15 µm, the gap between both glass substrates can be easily narrowed. In this case, a time necessary for performing laser sealing is shortened, and cracks and the like do not easily occur in the glass substrates and sealing portions even if there is a difference in thermal expansion coefficient between each of the glass substrates and the sealing material.

In the sealing material according to the second embodiment, the maximum particle diameter $D_{99}$ of the SnO-containing glass powder is preferably 30 µm or less, 20 µm or less, particularly preferably 10 µm or less. When the maximum particle diameter $D_{99}$ of the SnO-containing glass powder is controlled to 30 µm or less, the gap between both glass substrates can be easily narrowed. In this case, a time necessary for performing laser sealing is shortened, and cracks and the like do not easily occur in the glass substrates and sealing portions even if there is a difference in thermal expansion coefficient between each of the glass substrates and the sealing material.

In the sealing material according to the second embodiment, the glass composition of the SnO-containing glass is preferably the same composition as that described in the first embodiment.

Similarly, other components that can be added in addition to the above-mentioned components are the same components as those described in the first embodiment.

In the sealing material according to the second embodiment, the SnO-containing glass powder is preferably substantially free of transition metal oxides, and is preferably substantially free of PbO.

In the sealing material according to the second embodiment, the inorganic powder preferably comprises a refractory filler. The mixing ratio of the SnO-containing glass powder to the refractory filler in the inorganic powder is, in terms of vol %, preferably 40 to 100%:0 to 60%, 40 to 99.9%:0.1 to 60%, 45 to 90%:10 to 55%, 50 to 80%:20 to 50%, 50 to 70%:30 to 50%, particularly preferably 50 to 65%:35 to 50%.

Any of the compounds described in the first embodiment can be similarly used as the refractory filler.

The maximum particle diameter $D_{99}$ of the refractory filler is preferably 20 µm or less, 15 µm or less, particularly preferably 10 µm or less. If the maximum particle diameter $D_{99}$ of the refractory filler is more than 20 µm, some parts of sealing portions are liable to have a thickness of 30 µm or more, and hence the gap between glass substrates becomes non-uniform in an OLED display, and consequently, it becomes difficult to reduce the thickness of the OLED display. Further, when the maximum particle diameter $D_{99}$ of the refractory filler is controlled to 20 µm or less, the gap between both glass substrates can be easily narrowed. In this case, a time necessary for performing laser sealing is shortened, and cracks and the like do not easily occur in the glass substrates and sealing portions even if there is a difference in thermal expansion coefficient between each of the glass substrates and the sealing material.

In the sealing material according to the second embodiment, the softening point preferably falls within the ranges described in the first embodiment.

The SnO-containing glass powder contained in the sealing material according to the second embodiment has good compatibility with a low-expansion refractory filler, in particular, $NbZr(PO_4)_3$ and zirconium phosphate. In the sealing material according to the second embodiment, the thermal expansion coefficient preferably falls within the ranges described in the first embodiment.

The sealing material according to the second embodiment and a vehicle are preferably kneaded and processed into a paste material.

In the paste material according to the second embodiment, any of the resins described in the first embodiment is preferably used as a resin binder.

In the paste material according to the second embodiment, any of the solvents described in the first embodiment is preferably used as a solvent.

The paste material according to the second embodiment is preferably subjected to debinder treatment in an inert atmosphere, and is particularly preferably subjected to debinder treatment in an $N_2$ atmosphere.

The paste material according to the second embodiment is preferably subjected to laser sealing in an inert atmosphere, and is particularly preferably subjected to laser sealing in an $N_2$ atmosphere.

Further, a third embodiment of the present invention is described. The sealing material according to the third embodiment has a ratio of (the average particle diameter $D_{50}$ of SnO-containing glass powder)/(the average particle diameter $D_{50}$ of an refractory filler) of 0.6 to 4, preferably 0.8 to 3. If the ratio of (the average particle diameter $D_{50}$ of SnO-containing glass powder)/(the average particle diameter $D_{50}$ of an refractory filler) is less than 0.6, the specific surface area of the refractory filler becomes too large compared with that of the SnO-containing glass powder, the SnO-containing glass powder is liable to devitrify, and consequently, the sealing material may be inhibited from softening and flowing, and irregularities are liable to remain in the surface of a fired film owing to the denitrification. On the other hand, if the ratio of (the average particle diameter $D_{50}$ of SnO-containing glass powder)/(the average particle diameter $D_{50}$ of an refractory filler) is more than 4, the particle size of the refractory filler becomes large compared with that of the SnO-containing glass powder, and irregularities are liable to remain in the surface of a fired film because the refractory filler per se does not soften and flow. It should be noted that when irregularities in the surface of a fired film are large, the surface smoothness of the fired film is impaired, thus it becomes difficult to bring objects to be sealed uniformly (such as glass substrates) into close contact with each other before laser sealing, and consequently, laser sealing with a low output laser is difficult to be performed.

In the sealing material according to the third embodiment, the average particle diameter $D_{50}$ of the SnO-containing glass powder is preferably 1.0 to 3.0 µm, particularly preferably 1.5 to 2.5 µm. If the average particle diameter $D_{50}$ of the SnO-containing glass powder is less than 1.0 µm in a sealing material, glass is liable to denitrify at the time of firing and the sealing material may be inhibited from softening and flowing. Further, when a glass film is pulverized and the resultant glass powder is classified, particles of the glass powder are liable to aggregate, and after the glass powder is kneaded into a paste material, the glass aggregates remain in the paste material. Thus, the glass aggregates may cause the clogging of screen meshes at the time of screen printing. On the other hand, if the average particle diameter $D_{50}$ of the SnO-containing glass powder is more than 3.0 µm in a sealing material, the irregularities of a printing surface become too large at the time of screen printing, and it becomes difficult to enhance the surface smoothness of the resultant fired film. Besides, the sealing material does not easily soften and flow at the time of firing, and hence the firing temperature needs to be increased. In this case, objects to be sealed are liable to have larger thermal damage, which may be one reason for increasing cost.

In the sealing material according to the third embodiment, the average particle diameter $D_{50}$ of the refractory filler is preferably 0.5 to 2.0 µm, particularly preferably 0.5 to 1.8 µm. If the average particle diameter $D_{50}$ of the refractory filler is less than 0.5 µm in a sealing material, particles of the refractory filler are liable to melt into glass at the time of firing, and the sealing material may be inhibited from softening and flowing. Further, when the refractory filler is pulverized and the resultant refractory filler powder is classified, particles of the refractory filler powder are liable to aggregate, and after the refractory filler powder is kneaded into a paste material, the refractory filler aggregates remain in the paste material. Thus, the refractory filler aggregates may cause the clogging of screen meshes at the time of screen printing. On the other hand, if the average particle diameter $D_{50}$ of the refractory filler is more than 2.0 µm, the irregularities of a printing surface become too large at the time of screen printing, and it becomes difficult to enhance the surface smoothness of the resultant fired film.

In the sealing material according to the third embodiment, the 90% particle diameter $D_{90}$ of the SnO-containing glass powder is preferably 7.0 µm or less, and the 90% particle diameter $D_{90}$ of the refractory filler is preferably 5.0 µm or less. With this, the gap between both glass substrates can be easily narrowed. In this case, a time necessary for performing laser sealing is shortened, and cracks and the like do not easily occur in the glass substrates and sealing portions even if there is a difference in thermal expansion coefficient between each of the glass substrates and the sealing material.

In the sealing material according to the third embodiment, the maximum particle diameter $D_{99}$ of the SnO-containing glass powder is preferably 15 µm or less, and the maximum particle diameter $D_{99}$ of the refractory filler is preferably 10 µm or less. With this, the gap between both glass substrates can be easily narrowed. In this case, a time necessary for performing laser sealing is shortened, and cracks and the like do not easily occur in the glass substrates and sealing portions even if there is a difference in thermal expansion coefficient between each of the glass substrates and the sealing material.

In the sealing material according to the third embodiment, an inorganic pigment is preferably used as the pigment. Specifically, an inorganic pigment such as carbon described in the first embodiment can be used as well.

In the sealing material according to the third embodiment, the average particle diameter $D_{50}$ of the primary particles of the pigment is preferably 1 to 100 nm, 3 to 70 nm, 5 to 60 nm, particularly preferably 10 to 50 nm. If the average particle diameter $D_{50}$ of the primary particles of the pigment is too small, particles of the pigment easily aggregate to each other, and hence the particles of the pigment do not easily disperse uniformly in a sealing material, and the sealing material may not soften and flow locally at the time of laser sealing. On the other hand, if the average particle diameter $D_{50}$ of the primary particles of the pigment is too large, the particles of the pigment do not easily disperse uniformly in a sealing material as well, and the sealing material may not soften and flow locally at the time of laser sealing.

In the sealing material according to the third embodiment, the content of the pigment is preferably 0.05 to 1 mass %, particularly preferably 0.1 to 0.5 mass %. If the content of the pigment is too small in a sealing material, it becomes difficult to convert the energy of laser radiation to thermal energy. On the other hand, if the content of the pigment is too large in a sealing material, the sealing material does not easily soften and flow at the time of laser sealing, and it becomes difficult to enhance the sealing strength at the time of the laser sealing.

The pigment is preferably substantially free of Cr-based oxides from an environmental standpoint.

In the sealing material according to the third embodiment, the glass composition of the SnO-containing glass powder is preferably the same composition as that described in the first embodiment.

Similarly, other components that can be added in addition to the above-mentioned components are the same components as those described in the first embodiment.

In the sealing material according to the third embodiment, the SnO-containing glass powder is preferably substantially free of transition metal oxides, and is preferably substantially free of PbO.

The sealing material according to the third embodiment comprises a refractory filler as an essential component. The mixing ratio of the SnO-containing glass powder to the refractory filler is, in terms of vol %, preferably 40 to 99.9%: 0.1 to 60%, 45 to 90%:10 to 55%, 50 to 80%:20 to 50%, 50 to 70%:30 to 50%, particularly preferably 50 to 65%:35 to 50%.

Any of the compounds described in the first embodiment can be similarly used as the refractory filler.

In the sealing material of the present invention, the softening point preferably falls within the ranges described in the first embodiment.

The SnO-containing glass powder contained in the sealing material according to the third embodiment has good compatibility with a low-expansion refractory filler, in particular, $NbZr(PO_4)_3$ and zirconium phosphate. In the sealing material according to the third embodiment, the thermal expansion coefficient preferably falls within the ranges described in the first embodiment.

The sealing material according to the third embodiment and a vehicle are preferably kneaded and processed into a paste material.

In the paste material according to the third embodiment, any of the resins described in the first embodiment is preferably used as a resin binder.

In the paste material according to the third embodiment, any of the solvents described in the first embodiment is preferably used as a solvent.

The paste material according to the third embodiment is preferably subjected to debinder treatment in an inert atmosphere, and is particularly preferably subjected to debinder treatment in an $N_2$ atmosphere. With this, it becomes easy to prevent a situation in which the nature of SnO-containing glass powder is altered at the time of the debinder treatment.

The paste material according to the third embodiment is preferably subjected to laser sealing in an inert atmosphere, and is particularly preferably subjected to laser sealing in an $N_2$ atmosphere.

A method of producing a fired film according to the third embodiment comprises firing a paste material to produce a fired film, in which the firing comprises firing the above-mentioned paste material so that the fired film has a surface roughness Ra of 0.6 µm or less and a surface roughness RMS of 1.0 µm or less.

The surface roughness Ra of the fired film is preferably 0.6 µm or less, 0.5 µm or less, particularly preferably 0.4 µm or less. With this, strong sealing strength is easily secured after laser sealing.

The surface roughness RMS of the fired film is preferably 1.0 μm or less, 0.8 μm or less, particularly preferably 0.7 μm or less. With this, strong sealing strength is easily secured after laser sealing.

A laser sealing method according to the third embodiment comprises performing laser sealing by irradiating the above-mentioned fired film with laser radiation. With this, detachment of sealing portions can be easily prevented over a long period.

EXAMPLES

Example 1

Hereinafter, examples of the first embodiment are described in detail. It should be noted that the following examples are merely for illustrative purposes. The present invention is not limited to the following examples at all.

Table 2 shows each SnO-containing glass powder (Sample Nos. 1 to 7) according to the examples.

TABLE 2

|  | No. 1 | No. 2 | No. 3 | No. 4 | No. 5 | No. 6 | No. 7 |
|---|---|---|---|---|---|---|---|
| (mol %) | | | | | | | |
| SnO | 59 | 64 | 64 | 55 | 50 | 56 | 55.1 |
| $P_2O_5$ | 20 | 25 | 24 | 21 | 23 | 32 | 27 |
| ZnO | 5 | 4 | 3 | 10 | 10 | 8 | 13 |
| $B_2O_3$ | 15 | 4 | 7 | 10 | 12 |  | 0.9 |
| $Al_2O_3$ | 1 | 1 | 2 | 3 | 4 |  |  |
| $Li_2O$ |  | 1 |  |  | 1 | 2 | 2 |
| $K_2O$ |  | 1 |  | 1 |  | 2 | 2 |
| Melting temperature (° C.) | 950 | 900 | 900 | 950 | 950 | 900 | 900 |
| Glass transition point (° C.) | 320 | 295 | 307 | 323 | 334 | 305 | 310 |
| Softening point (° C.) | 395 | 365 | 378 | 393 | 407 | 380 | 385 |
| Thermal expansion coefficient ($\times 10^{-7}$/° C.) | 106 | 125 | 118 | 102 | 96 | 120 | 113 |

Each glass powder was prepared as follows. First, raw materials were blended so that each glass composition shown in Table 2 was attained. After that, each blended material was fed into an alumina crucible and was melted for 1 to 2 hours at each melting temperature shown in the table under a nitrogen atmosphere. Next, the resultant molten glass was formed into a film shape with a water-cooling roller. Subsequently, each glass film was pulverized with a ball mill, followed by classification of the particles of the resultant pulverized glass, yielding each type of glass powder with an average particle diameter $D_{50}$ of 2.5 μm and a maximum particle diameter $D_{99}$ of 7 μm.

Sample Nos. 1 to 7 were each evaluated for a glass transition point, a softening point, and a thermal expansion coefficient. Table 2 shows the results.

The glass transition point was determined by using a TMA apparatus.

The softening point was measured with a DTA apparatus. The measurement was started at room temperature at a temperature increase rate of 10° C./min under a nitrogen atmosphere.

The thermal expansion coefficient was determined by using a TMA apparatus. The range of measurement temperatures was set to 30 to 250° C.

As evident from Table 2, Sample Nos. 1 to 7 each had a glass transition point of 295 to 334° C., a softening point of 365 to 407° C., and a thermal expansion coefficient of 96 to 125×$10^{-7}$/° C.

Next, each sealing material was produced. Each of Glass Powder Nos. 1 to 7 described in Table 2, a refractory filler, and a pigment were mixed so that each mixed ratio shown in Table 3 was attained, yielding each sealing material (Samples A to G).

TABLE 3

|  |  | Example | | | | | Comparative Example | |
|---|---|---|---|---|---|---|---|---|
|  |  | A | B | C | D | E | F | G |
| Glass powder (vol %) | No. 1 | 60 | | | | | | |
|  | No. 2 | | 55 | | | | | |
|  | No. 3 | | | 57 | | | | |
|  | No. 4 | | | | 60 | | | |
|  | No. 5 | | | | | 62 | | |
|  | No. 6 | | | | | | 55 | |
|  | No. 7 | | | | | | | 55 |
| Refractory filler (vol %) | $NbZr(PO_4)_3$ | | | | 40 | 10 | | 20 |
|  | Zirconium phosphate | 40 | 45 | 43 | | 28 | 45 | 25 |
| Inorganic powder (mass %) |  | 99 | 99 | 99 | 99.3 | 98 | 99.9 | 99.8 |
| Pigment carbon (mass %) |  | 1 | 1 | 1 | 0.7 | 2 | 0.1 | 0.2 |
| Glass transition point (° C.) |  | 325 | 300 | 315 | 330 | 342 | 315 | 320 |
| Softening point (° C.) |  | 415 | 385 | 402 | 420 | 425 | 408 | 411 |
| Thermal expansion coefficient ($\times 10^{-7}$/° C.) [30-250° C.] |  | 47 | 45 | 43 | 41 | 43 | 46 | 47 |
| Flow diameter (mm) |  | 21.1 | 20.6 | 20.4 | 21.3 | 20.8 | 21.9 | 20.8 |
| Firing temperature (° C.) |  | 480 | 430 | 450 | 490 | 495 | 460 | 470 |
| Climate resistance |  | ○ | ○ | ○ | ○ | ○ | Δ | Δ |
| Laser sealing | 5 W 10 mm/s | ○ | ○ | ○ | ○ | ○ | x | x |
|  | 10 W 10 mm/s | ○ | ○ | ○ | ○ | ○ | x | x |

TABLE 3-continued

|  |  | Example | | | | | Comparative Example | |
|---|---|---|---|---|---|---|---|---|
|  |  | A | B | C | D | E | F | G |
| property Irradiation condition | 15 W 10 mm/s | o | o | o | o | o | x | o |

A zirconium phosphate powder and/or an NbZr (PO$_4$)$_3$ powder were/was used as the refractory filler. The zirconium phosphate powder and the NbZr(PO$_4$)$_3$ powder each had, as particle sizes, an average particle diameter D$_{50}$ of 2 µm and a maximum particle diameter D$_{99}$ of 8 µm. Further, a carbon powder with an average particle diameter D$_{50}$ of 0.5 µm and a maximum particle diameter D$_{99}$ of 3 µm was used as the pigment.

Samples A to G were each evaluated for a glass transition point, a softening point, a thermal expansion coefficient, a flow diameter, climate resistance, and laser sealing property. Table 3 shows the results.

The glass transition point was determined by using a TMA apparatus. It should be noted that a dense sintered body of each sample was used as a measurement sample.

The softening point was measured with a DTA apparatus. The measurement was started at room temperature at a temperature increase rate of 10° C./min under a nitrogen atmosphere.

The thermal expansion coefficient was determined by using a TMA apparatus. The range of measurement temperatures was set to 30 to 250° C. It should be noted that a dense sintered body of each sample was used as a measurement sample.

The flow diameter was evaluated as follows. First, each sample having a mass corresponding to an intended density was formed into a button shape with an outer diameter of 20 mm by subjecting the sample to dry pressing with a mold. Next, the button was placed on an alkali-free glass substrate (OA-10G manufactured by Nippon Electric Glass Co., Ltd.), was heated up to a firing temperature in the table with a temperature increase rate of 10° C./min under a nitrogen atmosphere, was kept at the firing temperature in the table for 10 minutes, and was then cooled to room temperature. Finally, the diameter of the fired button was measured. It should be noted that the fact that a button has a flow diameter of 20 mm or more means that the sample used for the button has good flowability at its firing temperature. As a sample has better flowability, the efficiency of laser sealing of the sample improves.

The climate resistance was evaluated as follows. First, 1 g of each sample was formed into a button shape with an outer diameter of 10 mm by subjecting the sample to dry pressing with a mold. Next, the button was placed on a high strain point glass substrate, was heated in air up to a temperature of (the softening point of each sample plus 30° C.) with a temperature increase rate of 10° C./min, was kept at the temperature for 10 minutes, and was then cooled to room temperature with a temperature drop rate of 10° C./min. Subsequently, a pressure cooker test (hereinafter, referred to as PCT) was performed on the fired button. Specifically, the fired button was kept under an environment with a temperature of 121° C., a humidity of 95%, and a pressure of 2 atm for 48 hours. Finally, the surface of the button after PCT was visually observed. A case where the entire surface of a button was glossy was represented by Symbol "o", a case where part of the surface of a button was not glossy was represented by Symbol "Δ", and a case where the entire surface of a button was not glossy was represented by Symbol "x". The climate resistance was evaluated on the basis of the criteria.

The laser sealing property was evaluated as follows. First, each sample and a vehicle were kneaded so that the resultant paste had a viscosity of about 150 Pa·s. After that, the paste was additionally kneaded in a three-roll mill so that a homogeneous paste was formed. It should be noted that a vehicle prepared by dissolving polyethylene carbonate (PEC having a molecular weight of 80,000) in propylene carbonate at 15 mass % was used. Next, the produced paste was coated to print a line on the central portion of a strip-shaped alkali-free glass substrate (OA-10G manufactured by Nippon Electric Glass Co., Ltd. with a dimension of 10 mm by 50 mm by 0.7 mm thick and a thermal expansion coefficient in the temperature range of 30 to 380° C. of 38×10$^{-7}$/° C.) so that the printed line had a line width of 0.8 mm, a length of 4 mm, and a thickness of 20 µm, followed by drying at 120° C. for 30 minutes in a drying oven. Subsequently, firing was performed at each softening point shown in Table 3 for 20 minutes under a nitrogen atmosphere, thereby performing debinder treatment. It should be noted that the temperature increase rate and the temperature drop rate of the firing were each set to 10° C./min. Further, on the alkali-free glass substrate on which the glazed film was formed, an alkali-free glass substrate having the same shape (OA-10G manufactured by Nippon Electric Glass Co., Ltd. with a dimension of 10 mm by 50 mm by 0.7 mm thick and a thermal expansion coefficient in the temperature range of 30 to 380° C. of 38×10$^{-7}$/° C.) was precisely laminated. After that, semiconductor laser radiation having a wavelength of 808 nm (outputs of 5 W, 10 W, and 15 W and a scanning speed of 10 mm/s) was applied along the glazed film from the side of the glass substrate on which no glazed film was formed. Finally, when a sample was softened by laser radiation and both glass substrates were bonded to each other, the sample was represented by Symbol "o", and when a sample was not softened and both glass substrates were not bonded, the sample was represented by Symbol "x".

As evident from Table 3, Samples A to E were able to bond glass substrates to each other under all laser irradiation conditions. The result shows that the energy of laser radiation was able to be efficiently converted to heat calories. Further, Samples A to E each had a thermal expansion coefficient of 50×10$^{7}$/° C. or less, and hence the thermal expansion coefficient matched with that of the glass substrates, and there was no abnormality such as a crack in bonded sites.

On the other hand, Sample F was not able to bond glass substrates to each other under any laser irradiation conditions. Further, Sample G was able to bond substrates at a laser output of 15 W, but was not able to bond substrates at laser outputs of 5 W and 10 W. These results show that because the content of the pigment was small, the energy of laser radiation was not able to be converted to heat calories efficiently.

Further, as evident from Table 3, Samples A to E each had a glass transition point of 300 to 342° C., a softening point of 385 to 425° C., a thermal expansion coefficient of 41 to 47×10$^{-7}$/° C., and a flow diameter of 20 mm or more at each firing temperature in the table. Further, Samples A to E were each evaluated as having good climate resistance. On the other hand, Samples F and G had poor climate resistance because part of the surface of each button was not glossy after PCT. This is probably because of the content of $P_2O_5$ and the content of $B_2O_3$ in SnO-containing powder. Specifically, the climate resistance of Sample F probably deteriorated because the content of $P_2O_5$ in its SnO-containing powder was 32%. Further, the climate resistance of Sample G probably deteriorated because the content of $B_2O_3$ in its SnO-containing powder was 0.9% though the content of $P_2O_5$ was 30% or less.

Example 2

Hereinafter, examples of the second embodiment are described in detail. It should be noted that the following examples are merely for illustrative purposes. The present invention is not limited to the following examples at all.

Table 4 shows each SnO-containing glass powder (Sample Nos. 8 to 14) according to the examples.

TABLE 4

|  | No. 8 | No. 9 | No. 10 | No. 11 | No. 12 | No. 13 | No. 14 |
|---|---|---|---|---|---|---|---|
| (mol %) | | | | | | | |
| SnO | 59 | 64 | 64 | 55 | 50 | 56 | 55.1 |
| $P_2O_5$ | 20 | 25 | 24 | 21 | 23 | 32 | 27 |
| ZnO | 5 | 4 | 3 | 10 | 10 | 8 | 13 |
| $B_2O_3$ | 15 | 4 | 7 | 10 | 12 | | 0.9 |
| $Al_2O_3$ | 1 | 1 | 2 | 3 | 4 | | |
| $Li_2O$ | | 1 | | | 1 | 2 | 2 |
| $K_2O$ | | 1 | | 1 | | 2 | 2 |
| Melting temperature (° C.) | 950 | 900 | 900 | 950 | 950 | 900 | 900 |

TABLE 4-continued

|  | No. 8 | No. 9 | No. 10 | No. 11 | No. 12 | No. 13 | No. 14 |
|---|---|---|---|---|---|---|---|
| Glass transition point (° C.) | 320 | 295 | 307 | 323 | 334 | 305 | 310 |
| Softening point (° C.) | 395 | 365 | 378 | 393 | 407 | 380 | 385 |
| Thermal expansion coefficient (×10$^{-7}$/° C.) | 106 | 125 | 118 | 102 | 96 | 120 | 113 |

Each glass powder was prepared as follows. First, raw materials were blended so that each glass composition shown in Table 4 was attained. After that, each blended material was fed into an alumina crucible and was melted for 1 to 2 hours at each melting temperature shown in the table under a nitrogen atmosphere. Next, the resultant molten glass was formed into a film shape with a water-cooling roller. Subsequently, each glass film was pulverized with a ball mill, followed by classification of the particles of the resultant pulverized glass, yielding each type of glass powder with an average particle diameter $D_{50}$ of 2.5 μm and a maximum particle diameter $D_{99}$ of 10 μm.

Sample Nos. 8 to 14 were each evaluated for a glass transition point, a softening point, and a thermal expansion coefficient. Table 4 shows the results.

It should be noted that the glass transition point, the softening point, and the thermal expansion coefficient were each measured under the same condition as that in Example 1.

As evident from Table 4, Sample Nos. 8 to 14 each had a glass transition point of 295 to 334° C., a softening point of 365 to 407° C., and a thermal expansion coefficient of 96 to 125×10$^{-7}$/° C.

Next, each sealing material was produced. Each of Glass Powder Nos. 8 to 14 described in Table 4, a refractory filler, and a pigment were mixed so that each mixed ratio shown in Table 5 was attained, yielding each sealing material (Samples H to N).

TABLE 5

|  |  | Example | | | | | Comparative Example | |
|---|---|---|---|---|---|---|---|---|
|  |  | H | I | J | K | L | M | N |
| Glass powder (vol %) | No. 8 | 60 | | | | | | |
|  | No. 9 | | 55 | | | | | |
|  | No. 10 | | | 57 | | | | |
|  | No. 11 | | | | 60 | | | |
|  | No. 12 | | | | | 62 | | |
|  | No. 13 | | | | | | 55 | |
|  | No. 14 | | | | | | | 55 |
| Refractory filler (vol %) | NbZr(PO$_4$)$_3$ | | | | 40 | 10 | | 20 |
|  | Zirconium phosphate | 40 | 45 | 43 | | 28 | 45 | 25 |
| Inorganic powder (mass %) | | 99.75 | 99.9 | 99.65 | 99.1 | 99.92 | 99.99 | 99.96 |
| Pigment carbon (mass %) | | 0.25 | 0.1 | 0.35 | 0.9 | 0.08 | 0.01 | 0.04 |
| Glass transition point (° C.) | | 327 | 305 | 317 | 336 | 343 | 319 | 323 |
| Softening point (° C.) | | 418 | 388 | 405 | 422 | 426 | 410 | 411 |
| Thermal expansion coefficient (×10$^{-7}$/° C.) [30-250° C.] | | 48 | 46 | 44 | 43 | 43 | 47 | 49 |
| Climate resistance | | ○ | ○ | ○ | ○ | ○ | Δ | Δ |
| Laser sealing property Irradiation condition | 5 W 10 mm/s | ○ | ○ | ○ | ○ | ○ | x | x |
|  | 10 W 10 mm/s | ○ | ○ | ○ | ○ | ○ | x | x |
|  | 15 W 10 mm/s | ○ | ○ | ○ | ○ | ○ | x | ○ |

Zirconium phosphate and/or NbZr (PO$_4$)$_3$ were/was used as the refractory filler. Zirconium phosphate and NbZr (PO$_4$)$_3$ each had, as particle sizes, an average particle diameter D$_{50}$ of 1.5 μm and a maximum particle diameter D$_{99}$ of 6 μm. Further, ketjen black (graphite) was used as the pigment and the average particle diameter D$_{50}$ of its primary particles was 20 nm.

Samples H to N were each evaluated for a glass transition point, a softening point, a thermal expansion coefficient, climate resistance, and laser sealing property. Table 5 shows the results.

The glass transition point, the softening point, the thermal expansion coefficient, and the climate resistance were each measured under the same condition as that in Example 1. Further, the laser sealing property was measured under the same condition as that in Example 1, except that a vehicle prepared by dissolving polyethylene carbonate (PEC having a molecular weight of 200,000) in propylene carbonate at 20 mass % was used and that debinder treatment was performed at each softening point shown in Table 4.

As evident from Table 5, Samples H to L were able to bond glass substrates to each other under all laser irradiation conditions. The result shows that the energy of laser radiation was able to be efficiently converted to heat calories. Further, Samples H to L each had a thermal expansion coefficient of 50×10$^{-7}$/° C. or less, and hence the thermal expansion coefficient matched with that of the glass substrates, and there was no abnormality such as a crack in bonded sites.

On the other hand, Sample M was not able to bond glass substrates to each other under any laser irradiation conditions. Further, Sample N was able to bond substrates with a laser output of 15 W, but was not able to bond substrates with laser outputs of 5 W and 10 W. These results show that the energy of laser radiation was not able to be converted to heat calories efficiently.

Further, as evident from Table 5, Samples H to L each had a glass transition point of 305 to 343° C., a softening point of 388 to 426° C., and a thermal expansion coefficient of 43 to 49×10$^{-7}$/° C. Further, Samples H to L were each evaluated as having good climate resistance. On the other hand, Samples M and N had poor climate resistance because part of the surface of each button was not glossy after PCT. This is probably because of the content of P$_2$O$_5$ and the content of B$_2$O$_3$ in SnO-containing powder. Specifically, the climate resistance of Sample F probably deteriorated because the content of P$_2$O$_5$ in its SnO-containing powder was 32%. Further, the climate resistance of Sample G probably deteriorated because the content of B$_2$O$_3$ in its SnO-containing powder was 0.9% though the content of P$_2$O$_5$ was 30% or less.

Example 3

Each sealing material (Samples O to U) was produced in the same manner as that used for producing Sample H in Table 5 except that only the average particle diameter D$_{50}$ of the primary particles of the pigment was changed and adjusted. The sealing material was used to survey the influence of the average particle diameter D$_{50}$ of the primary particles of the pigment on the softening and flow characteristics. Table 6 shows the results.

TABLE 6

|  | Comparative Example | Example | | | | | Comparative Example |
|---|---|---|---|---|---|---|---|
|  | O | P | Q | R | S | T | U |
| Average particle diameter (nm) of primary particles of pigment | 0.1 | 2 | 12 | 22 | 35 | 72 | 120 |
| Softening and flow characteristics | x | Δ | ○ | ○ | ○ | Δ | x |

The softening and flow characteristics were evaluated as follows. That is, a glass substrate with a glazed film produced under the same condition as that used for producing the glass substrate with a glazed film in order to evaluate laser sealing property in Example 2 was irradiated with laser radiation under the same condition as that used for evaluating laser sealing property in Example 2, and bonded portions were finally observed. A case where a glazed film properly softened and flowed was represented by Symbol "○", a case where only a few parts of a glazed film did not soften and flow was represented by Symbol "Δ", and a case where many parts of a glazed film did not soften and flow was represented by Symbol "x". The softening and flow characteristics were evaluated on the basis of the criteria.

As evident from Table 6, Samples P to T, in particular, Samples Q to S had good softening and flow characteristics because the average particle diameter D$_{50}$ of the primary particles of the pigment used in each sample fell within a predetermined range. However, Samples O and U had poor softening and flow characteristics because the average particle diameter D$_{50}$ of the primary particles of the pigment used in each sample did not fall within a predetermined range.

Example 4

Hereinafter, examples of the third embodiment are described in detail. It should be noted that the following examples are merely for illustrative purposes. The present invention is not limited to the following examples at all.

Table 7 shows examples (Sample Nos. 15 to 19) of the present invention and comparative examples (Sample Nos. 20 and 21).

TABLE 7

|  |  | Example | | | | | Comparative Example | |
|---|---|---|---|---|---|---|---|---|
|  |  | No. 15 | No. 16 | No. 17 | No. 18 | No. 19 | No. 20 | No. 21 |
| Particle size (μm) of SnO-containing glass powder | D$_{50}$ | 2.1 | 1.8 | 2.6 | 1.6 | 2.4 | 0.8 | 3.7 |
|  | D$_{90}$ | 4.6 | 3.6 | 5.6 | 3.3 | 5.1 | 2.9 | 8.2 |
|  | D$_{99}$ | 7.9 | 5.5 | 8.8 | 4.9 | 8.1 | 4.4 | 12.6 |
| Particle size (μm) of refractory filler | D$_{50}$ | 1.5 | 1.4 | 0.7 | 1.9 | 0.9 | 2.1 | 0.7 |
|  | D$_{90}$ | 3.2 | 3.0 | 2.7 | 3.7 | 2.9 | 4.5 | 2.7 |
|  | D$_{99}$ | 5.2 | 4.7 | 3.9 | 5.9 | 4.1 | 7.2 | 3.9 |
| Ratio of (D$_{50}$ of glass powder)/(D$_{50}$ of filler) |  | 1.4 | 1.3 | 3.7 | 0.8 | 2.7 | 0.4 | 5.3 |

TABLE 7-continued

|  |  | Example |  |  |  |  | Comparative Example |  |
|---|---|---|---|---|---|---|---|---|
|  |  | No. 15 | No. 16 | No. 17 | No. 18 | No. 19 | No. 20 | No. 21 |
| Softening point (° C.) |  | 397 | 396 | 401 | 392 | 400 | 391 | 403 |
| Thermal expansion coefficient [30-250° C.] (×$10^{-7}$/° C.) |  | 47 | 48 | 49 | 47 | 48 | 46 | 49 |
| Average thickness (μm) of fired film |  | 15 | 13 | 13 | 12 | 13 | 11 | 18 |
| Surface roughness (μm) | Ra | 0.5 | 0.3 | 0.3 | 0.4 | 0.5 | 1.1 | 1.2 |
|  | RMS | 0.8 | 0.5 | 0.6 | 0.7 | 0.8 | 1.4 | 1.6 |
| Laser irradiation condition 0.8 mm | Output (W) | 22 | 24 | 24 | 25 | 24 | 25 | 20 |
|  | Irradiation rate (mm/s) | 25 | 25 | 25 | 25 | 25 | 24 | 25 |
| HAST test | Detachment | Absent | Absent | Absent | Absent | Absent | Present | Present |

Each SnO-containing glass powder was prepared as follows. First, raw materials were blended so that a predetermined glass composition (59% of SnO, 20% of $P_2O_5$, 5% of ZnO, 15% of $B_2O_3$, and 1% of $Al_2O_3$ in terms of mol %) was attained. After that, the blended material was fed into an alumina crucible and was melted for 1 to 2 hours at 900° C. under a nitrogen atmosphere. Next, the resultant molten glass was formed into a film shape with a water-cooling roller. Subsequently, the glass film was pulverized with a ball mill, followed by classification of the particles of the resultant pulverized glass, yielding each SnO-containing glass powder with the particle sizes described in the table.

A zirconium phosphate powder was used as the refractory filler. The pulverization condition and classification condition of zirconium phosphate were adjusted, thereby yielding each refractory filler with the particle sizes described in the table.

Ketjen black (graphite) was used as a pigment. The average particle diameter $D_{50}$ of the primary particles of the pigment was 20 nm.

The particle sizes of the SnO-containing glass powder, the refractory filler, and the pigment are values each measured with a laser diffraction particle-size distribution analyzer.

An inorganic powder (containing 60 vol % of SnO-containing glass powder and 40 vol % of a refractory filler) which had been prepared as describe above and a pigment were mixed at 99.75 mass % and 0.25 mass %, respectively, thus producing a sealing material.

The resultant sealing material was used to measure a softening point and a thermal expansion coefficient.

The softening point and the thermal expansion coefficient were measured under the same conditions as those in Example 1.

A paste material was produced as follows. First, a sealing material and a vehicle were kneaded so that the resultant substance had a viscosity of about 100 Pa·s (25° C., shear rate: 4). After that, the substance was additionally kneaded in a three-roll mill so that a homogeneous paste was formed. A polyethylene carbonate resin (having a molecular weight of 129,000) was used as a resin component of the vehicle and propylene carbonate was used as a solvent component of the vehicle. It should be noted that a vehicle prepared by dissolving polyethylene carbonate (PEC having a molecular weight of 200,000) in propylene carbonate at 20 mass % was used. Next, the above-mentioned paste material was used to perform printing with a screen printing machine on the peripheral portion of a glass substrate (OA-10G manufactured by Nippon Electric Glass Co., Ltd.) with a dimension of 40 mm in length by 50 mm in width by 0.5 mm in thickness so that the printed portion had a thickness of about 30 μm and a width of about 0.6 mm, followed by drying at 120° C. for 30 minutes under an air atmosphere. After that, the resultant film was fired at 480° C. for 10 minutes under a nitrogen atmosphere to burn a resin component in the paste (debinder treatment) and to perform the fixation of the sealing material, thereby yielding a fired film with the average thickness and the surface roughnesses (Ra and RMS) described in the table.

The thickness of the fired film is a value measured with a noncontact-type laser film thickness meter.

The surface roughnesses (Ra and RMS) of the fired film are values each measured with a surface roughness meter.

Subsequently, on the fired film on the glass substrate, a glass substrate (OA-10G manufactured by Nippon Electric Glass Co., Ltd.) with a dimension of 50 mm in length by 50 mm in width by 0.5 mm in thickness was placed under a nitrogen atmosphere. After that, laser radiation having a wavelength of 808 nm was applied along the fired film from the side of the glass substrate on which the fired film was formed, thereby softening and flowing the fired film and sealing the glass substrates to each other to attain air tightness. It should be noted that the irradiation condition (output and irradiation rate) of the laser radiation was adjusted depending on the average thickness of the fired film.

Pressure cooker test: After a highly accelerated temperature and humidity stress test (HAST test) was performed, the presence or absence of detachment at sealing portions was observed to evaluate the sealing property of each sample after laser sealing. It should be noted that the conditions of the HAST test are a temperature of 121° C., a humidity of 100%, a pressure of 2 atm, and a testing time of 24 hours.

As evident from Table 7, Sample Nos. 15 to 19 maintained strong sealing property after each HAST test because detachment did not occur at each sealing portion. Further, the fired film of each of Sample Nos. 15 to 19 had good surface smoothness because the surface roughness Ra of the fired film was 0.3 to 0.5 μm and its surface roughness RMS was 0.5 to 0.8 μm. On the other hand, in the case of Sample Nos. 20 and 21, detachment was found at all sealing portions after each HAST test. Further, the fired film of each of Sample Nos. 20 and 21 had poor surface smoothness because the surface roughness Ra of the fired film was 1.1 to 1.2 μm and its surface roughness RMS was 1.4 to 1.6 μm.

INDUSTRIAL APPLICABILITY

The sealing material of the present invention is suitable not only for laser sealing of an OLED device but also for laser sealing of a solar cell such as a dye-sensitized solar cell, laser sealing of an MEMS package, and laser sealing of a lithium ion secondary battery.

The invention claimed is:

1. A sealing material for laser sealing, comprising 80 to 99.7 mass % of an inorganic powder containing SnO-containing glass powder, 0.3 to 20 mass % of a pigment, and a refractory filler having a maximum particle diameter $D_{99}$ of 10 μm or less,
    wherein the sealing material has a thermal expansion coefficient of $75\times10^{-7}$/° C. or less.

2. The sealing material according to claim 1, wherein the SnO-containing glass powder comprises, as a glass composition in terms of mol %, 35 to 70% of SnO and 10 to 30% of $P_2O_5$.

3. The sealing material according to claim 2, wherein the SnO-containing glass powder further comprises, as a glass composition in terms of mol %, 1 to 20% of ZnO, 1 to 20% of $B_2O_3$, and 0.1 to 10% of $Al_2O_3$.

4. The sealing material according to claim 1, wherein the pigment comprises at least one selected from carbon (C), $Co_3O_4$, CuO, $Cr_2O_3$, $Fe_2O_3$, $MnO_2$, SnO, and $Ti_nO_{2n-1}$ where n represents an integer.

5. The sealing material according to claim 1, wherein the inorganic powder comprises 0.1 to 60 vol % of the refractory filler.

6. The sealing material according to claim 1, wherein the refractory filler comprises at least one selected from cordierite, zircon, tin oxide, niobium oxide, zirconium phosphate, zirconium phosphate tungstate, and $NbZr(PO_4)_3$.

7. The sealing material according to claim 1, which is used for sealing an OLED device.

8. A paste material, comprising a sealing material and a vehicle, wherein the sealing material comprises the sealing material according to claim 1 and the vehicle comprises an aliphatic polyolefin-based carbonate.

9. The paste material according to claim 8, wherein the vehicle comprises at least one selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG).

10. The paste material according to claim 8, which is subjected to debinder treatment in an inert atmosphere.

11. The paste material according to claim 8, which is subjected to laser sealing in an inert atmosphere.

12. A sealing material for laser sealing, comprising 99 to 99.95 mass % of an inorganic powder containing SnO-containing glass powder, 0.05 to 1 mass % of a pigment, and a refractory filler having a maximum particle diameter $D_{99}$ of 10 μm or less,
    wherein primary particles of the pigment have an average particle diameter $D_{50}$ of 1 to 100 nm, and
    wherein the sealing material has a thermal expansion coefficient of $75\times10^{-7}$/° C. or less.

13. The sealing material according to claim 12, wherein the pigment comprises carbon.

14. The sealing material according to claim 12, wherein the pigment is amorphous carbon or graphite.

15. The sealing material according to claim 12, wherein the SnO-containing glass powder comprises, as a glass composition in terms of mol %, 35 to 70% of SnO and 10 to 30% of $P_2O_5$.

16. The sealing material according to claim 15, wherein the SnO-containing glass powder further comprises, as a glass composition, 1 to 20 mol % of ZnO.

17. The sealing material according to claim 15, wherein the SnO-containing glass powder further comprises, as a glass composition, 1 to 20 mol % of $B_2O_3$.

18. The sealing material according to claim 15, wherein the SnO-containing glass powder further comprises, as a glass composition, 0.1 to 10 mol % of $Al_2O_3$.

19. The sealing material according to claim 12, wherein the inorganic powder comprises 0.1 to 60 vol % of the refractory filler.

20. The sealing material according to claim 19, wherein the refractory filler comprises at least one selected from cordierite, zircon, tin oxide, niobium oxide, zirconium phosphate-based ceramic, and $NbZr(PO_4)_3$.

21. The sealing material according to claim 12, which is used for sealing an OLED device.

22. A paste material, comprising a sealing material and a vehicle, wherein the sealing material comprises the sealing material according to claim 12 and the vehicle comprises an aliphatic polyolefin-based carbonate.

23. The paste material according to claim 22, wherein the vehicle further comprises at least one selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG).

24. The paste material according to claim 22, which is subjected to debinder treatment in an inert atmosphere.

25. The paste material according to claim 22, which is subjected to laser sealing in an inert atmosphere.

* * * * *